United States Patent
Lu et al.

(10) Patent No.: US 11,357,126 B2
(45) Date of Patent: Jun. 7, 2022

(54) LOCKING STRUCTURE AND SERVER CABINET WITH SAME

(71) Applicant: Fulian Precision Electronics (Tianjin) Co., LTD., Tianjin (CN)

(72) Inventors: Wen-Hu Lu, Tianjin (CN); Zhen-Lei Li, Tianjin (CN)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 2 days.

(21) Appl. No.: 17/017,454

(22) Filed: Sep. 10, 2020

(65) Prior Publication Data
US 2021/0368644 A1 Nov. 25, 2021

(30) Foreign Application Priority Data
May 19, 2020 (CN) .......................... 202010427279.7

(51) Int. Cl.
*H05K 7/00* (2006.01)
*H05K 7/14* (2006.01)

(52) U.S. Cl.
CPC .................................. *H05K 7/1488* (2013.01)

(58) Field of Classification Search
CPC . E05C 3/00; E05C 3/002; E05C 3/004; E05C 3/12; E05C 3/124; E05C 3/14; E05C 3/145; E05C 5/99; E05C 2005/005; E05C 19/006; E05C 1/00; E05C 1/004; E05C 1/02; E05C 1/06; E05C 1/04; E05C 1/10; E05C 1/065; E05B 57/00; E05B 65/006; E05B 65/0064; E05B 65/0067; E05B 65/0089; E05B 65/02; Y10S 292/11; H05K 5/023; H05K 5/03; H05K 5/0221; H05K 5/0204; H05K 5/0239; H05K 7/1488; Y10T 292/096; Y10T 292/1015; Y10T 292/102; Y10T 292/1016
USPC ............ 312/223.2, 223.1, 265.5, 265.1, 244, 312/332.1; 220/345.1, 351, 345.4;
(Continued)

(56) References Cited

U.S. PATENT DOCUMENTS 6,362,975 B1 * 3/2002 Liu .......................... G06F 1/181
292/207
2012/0287573 A1 * 11/2012 Anguiano-Wehde .......................
H05K 7/1487
361/679.58

(Continued)

FOREIGN PATENT DOCUMENTS

CN 209327925 U 8/2019
TW 201707542 A 2/2017

*Primary Examiner* — Janet M Wilkens
(74) *Attorney, Agent, or Firm* — ScienBiziP, P.C.

(57) ABSTRACT

A space-saving locking structure without sharp edges for a server cabinet can lock a first housing to a second housing and includes first and second locking members. The first locking member includes a locking portion with a tail portion, the second locking member includes a blocking portion. The blocking portion has a rounded surface such that when the first housing is pressed along a first direction, the first housing approaches and closes with the second housing, the tail portion being set against a top of the blocking portion. When the first housing is further pushed in a second direction, the tail portion slides along the rounded surface of the blocking portion until the tail portion abuts against the blocking portion to lock the first housing to the second housing.

18 Claims, 7 Drawing Sheets

(58) Field of Classification Search
USPC ............ 49/463; 174/50; 361/379.33, 679.37,
361/679.58, 726, 727, 801, 796, 683, 725
See application file for complete search history.

(56) References Cited

U.S. PATENT DOCUMENTS

2016/0102486 A1* 4/2016 Eckberg ............... H05K 5/0221
292/108
2017/0042055 A1 2/2017 Chen et al.

* cited by examiner

LOCKING STRUCTURE AND SERVER CABINET WITH SAME

FIELD

The subject matter herein generally relates to server construction and a locking structure.

BACKGROUND

Space constraints in most existing server cabinets allow only one locking structure at a middle of an upper cover of the server. In this way, during an entire handling of the server, openings may appear in some locations, and the sharp edges of the openings can scratch the hand of a user.

Therefore, there is room for improvement within the art.

BRIEF DESCRIPTION OF THE DRAWINGS

Many aspects of the disclosure can be better understood with reference to the figures. The components in the figures are not necessarily drawn to scale, the emphasis instead being placed upon clearly illustrating the principles of the disclosure.

DETAILED DESCRIPTION

Figure 1:
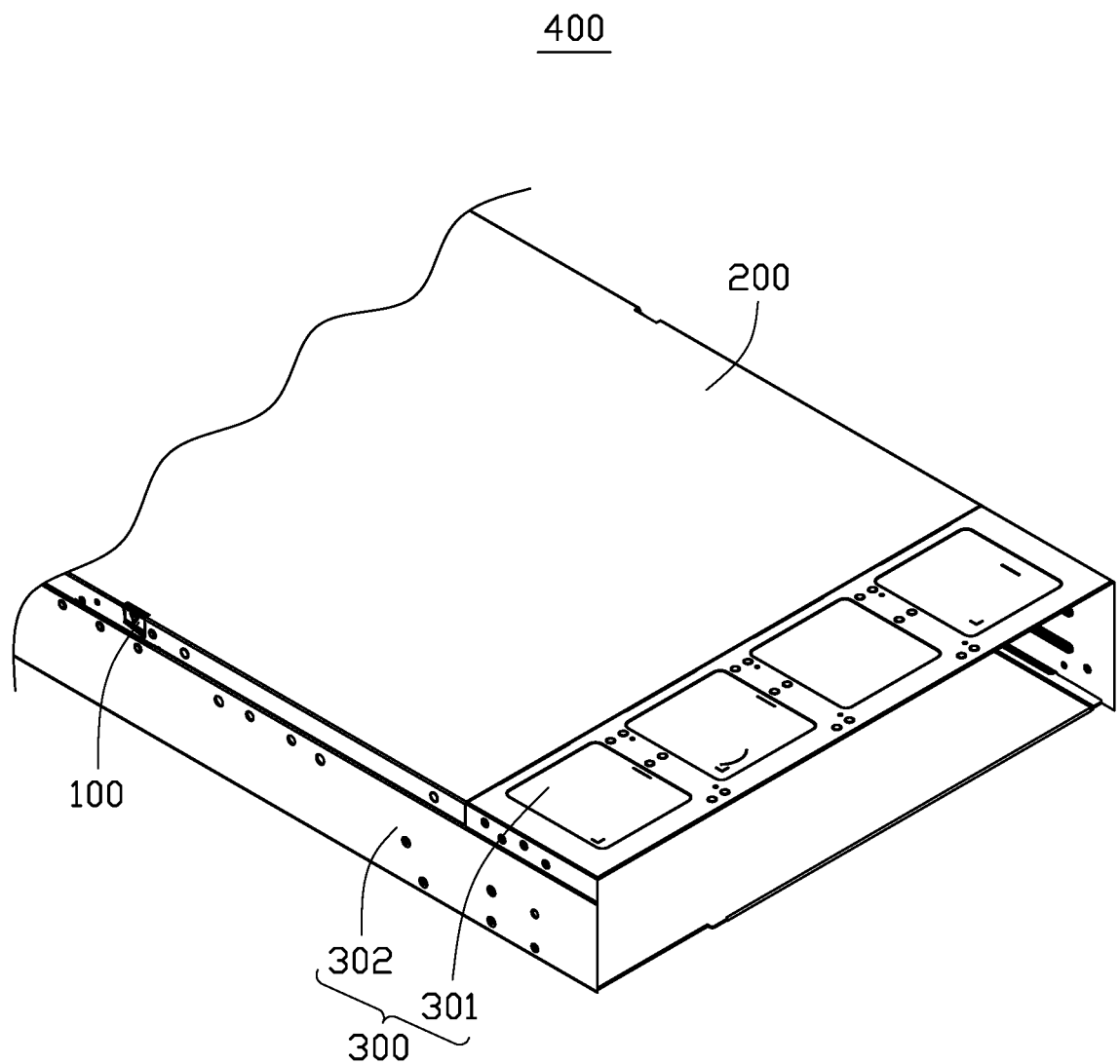
FIG. 1 is an isometric view of a server cabinet according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series, and the like.

FIG. 1 illustrates a server cabinet 400. The server cabinet 400 includes a locking structure 100, a first housing 200, and a second housing 300. The locking structure 100 is configured to lock the first housing 200 to the second housing 300. The second housing 300 includes a top wall 301 and two side walls 302. The two side walls 302 are oppositely arranged and are both connected to the top wall 301. The first housing 200 covers the side walls 302. The locking structure 100 of the server cabinet 400 further can drive the first housing 200, so that one end of a top wall of the first housing 200 can be engaged with the top wall 301.

Figure 2:
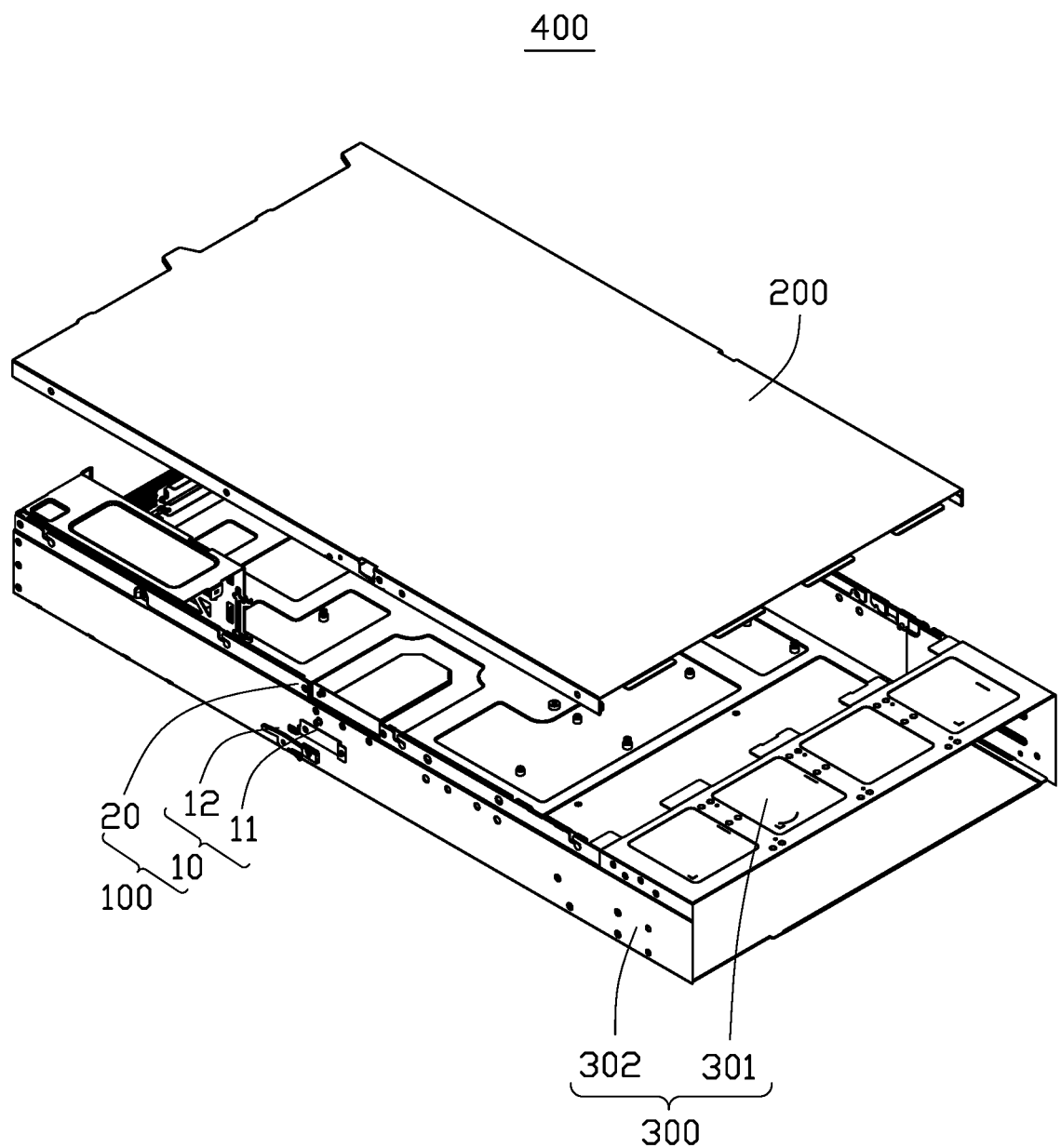
FIG. 2 is an exploded, isometric view of the server cabinet of FIG. 1.

As illustrated in FIG. 2, in this embodiment, after the first housing 200 is engaged with the top wall 301 of the second housing 300, a structure which is formed by the first housing 200 and the top wall 301 being connected together can be closed on an outside of the two side walls 302. The locking structure 100 is arranged between the first housing 200 and the side wall 302 of the second housing 300, so that the first housing 200 and the side wall 302 are completely locked. That is, when the first housing 200 moves in a first direction, such as a vertical direction, toward the second housing 300, and then moves in a second direction, such as a horizontal direction, the first housing 200 will be locked with the top wall 301 through the locking structure 100.

Figure 3:
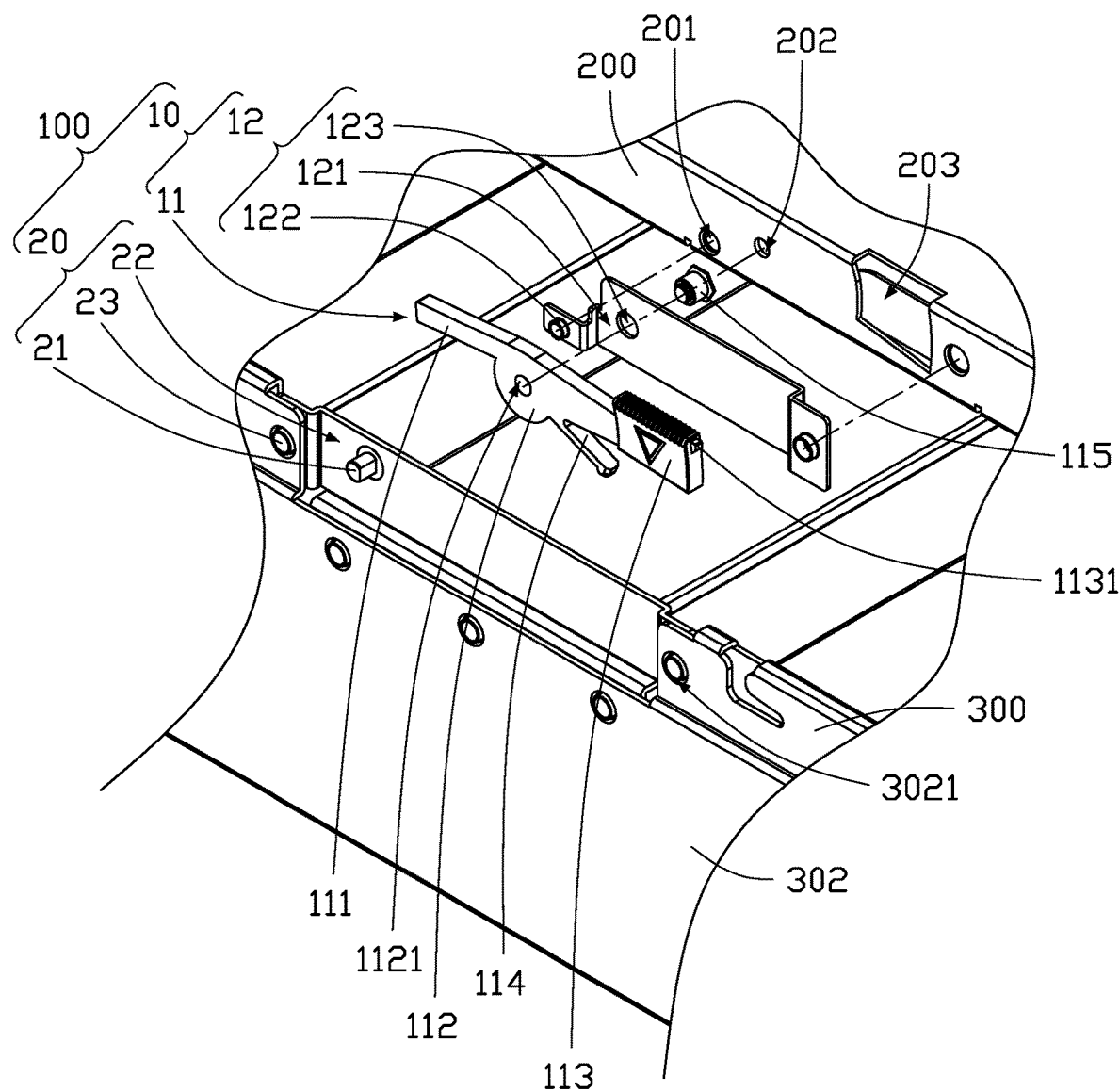
FIG. 3 is an exploded, isometric view of a locking structure of the server cabinet of FIG. 2.

As illustrated in FIG. 3, in this embodiment, the first housing 200 defines a first mounting hole 201. The locking structure 100 includes a first locking member 10 and a second locking member 20. The first locking member 10 is arranged inside a side wall of the first housing 200. The second locking member 20 is positioned on the side wall 302 of the second housing 300. The first locking member 10 includes a locking portion 11. The second locking member 20 includes a blocking portion 21. When the locking portion 11 abuts against one side of the blocking portion 21, the first locking member 10 and the second locking member 20 are locked, and the first housing 200 and the second housing 300 are locked together.

In this embodiment, the first locking member 10 further includes a connecting portion 12. The connecting portion 12 is configured to receive the locking portion 11. The connecting portion 12 is fixed on the first housing 200. In this embodiment, the connecting portion 12 is positioned on the inner side of the side wall of the first housing 200. The connecting portion 12 is configured to accommodate the locking portion 11. The connecting portion 12 is approximately rectangular. A middle of the connecting portion 12 is straight. The ends of the connecting portion 12 extend to one side to form a receiving portion 121. The extensions at both ends of the receiving portion 121 are bent toward an end away from the receiving portion 121, and a first mounting portion 122 is formed at the locations of the bends of the receiving portion 121.

In this embodiment, a location of the first mounting portion 122 matches the location of the first mounting hole 201 of the first housing 200. The first mounting portion 122 is mounted to the first mounting hole 201 so that the connecting portion 12 is fixed on the inner side of the side wall of the first housing 200. In this embodiment, the first mounting portion 122 may be a cylinder.

In this embodiment, the receiving portion 121 is configured to receive the locking portion 11. The locking portion 11 can rotate relative to the connecting portion 12. In this embodiment, a first rotating hole 123 is defined on a flat portion of the receiving portion 121. The locking portion 11 is substantially plate-shaped. The locking portion 11 includes a tail portion 111, a plate body 112, and a pressing portion 113. The tail portion 111, the plate body 112, and the pressing portion 113 are connected in sequence and are formed integrally to form the locking portion 11.

The plate body 112 is configured to rotatably connect with the connecting portion 12. In this embodiment, part of the plate body 112 is arc-shaped, which makes it easier to rotate. A second rotating hole 1121 is defined in the plate body 112. The second rotating hole 1121 corresponds to the location of the first rotating hole 123 of the receiving portion 121. The first housing 200 also defines a third rotating hole 202. By passing a rotating member 115 through the first rotating hole 123, the second rotating hole 1121, and the third rotating hole 202 in sequence, the locking portion 11 is installed on the connecting portion 12 and can be wound around the rotating member 115. In this embodiment, the locking portion 11 is sandwiched between the connecting portion 12 and the side wall of the first housing 200.

The tail portion 111 of the locking portion 11 is elongated. The tail portion 111 is positioned at one end of the plate body 112. The pressing portion 113 has a substantially rectangular shape. The pressing portion 113 is positioned at the other end of the plate body 112 opposite to the tail portion 111. After the locking structure 100 is locked, the first housing 200 and the second housing 300 can be unlocked by pressing the pressing portion 113. Specifically, in this embodiment, a high-friction pattern 1131 is formed on one side of the pressing portion 113, the texture of the pattern 1131 being convenient for pressing and not being slippery. In addition, the pattern 1131 having obvious shape characteristics and good friction facilitates the discovery of the pressing portion 113 by the hand of a user and is easy to operate.

In this embodiment, the side wall of the first housing 200 further defines an opening 203. The opening 203 exposes the side of the pressing portion 113 with the pattern 1131, allowing the pressing of the pressing portion 113 through the opening 203 from the outside of the first housing 200.

In this embodiment, the locking portion 11 further includes a pop-up portion 114. The pop-up portion 114 extends from the connection between the plate body 112 and the pressing portion 113 in a direction away from the pressing portion 113. The pop-up portion 114 is substantially a strip of material. An angle formed between the extension direction of the pop-up portion 114 and the extension direction of the pressing portion 113 is less than 90 degrees. In this embodiment, the pop-up portion 114 and the tail portion 111 extend along two substantially opposite directions of the plate body 112. The pop-up portion 114 is made of elastic material. When the pop-up portion 114 undergoes elastic deformation, an elastic force is generated. In this way, under the elastic force of the pop-up portion 114, the tail portion 111 positioned opposite to the pop-up portion 114 rotates correspondingly.

In this embodiment, one end of the receiving portion 121 is partially extended and bent. In this way, when the locking portion 11 is received in the receiving portion 121, the plate body 112 and the pressing portion 113 are received in the receiving portion 121, and the tail portion 111 protrudes from the end of the receiving portion 121 which is not completely extended and bent. A gap is left between the pressing portion 113 and the side wall of the receiving portion 121.

Figure 4:
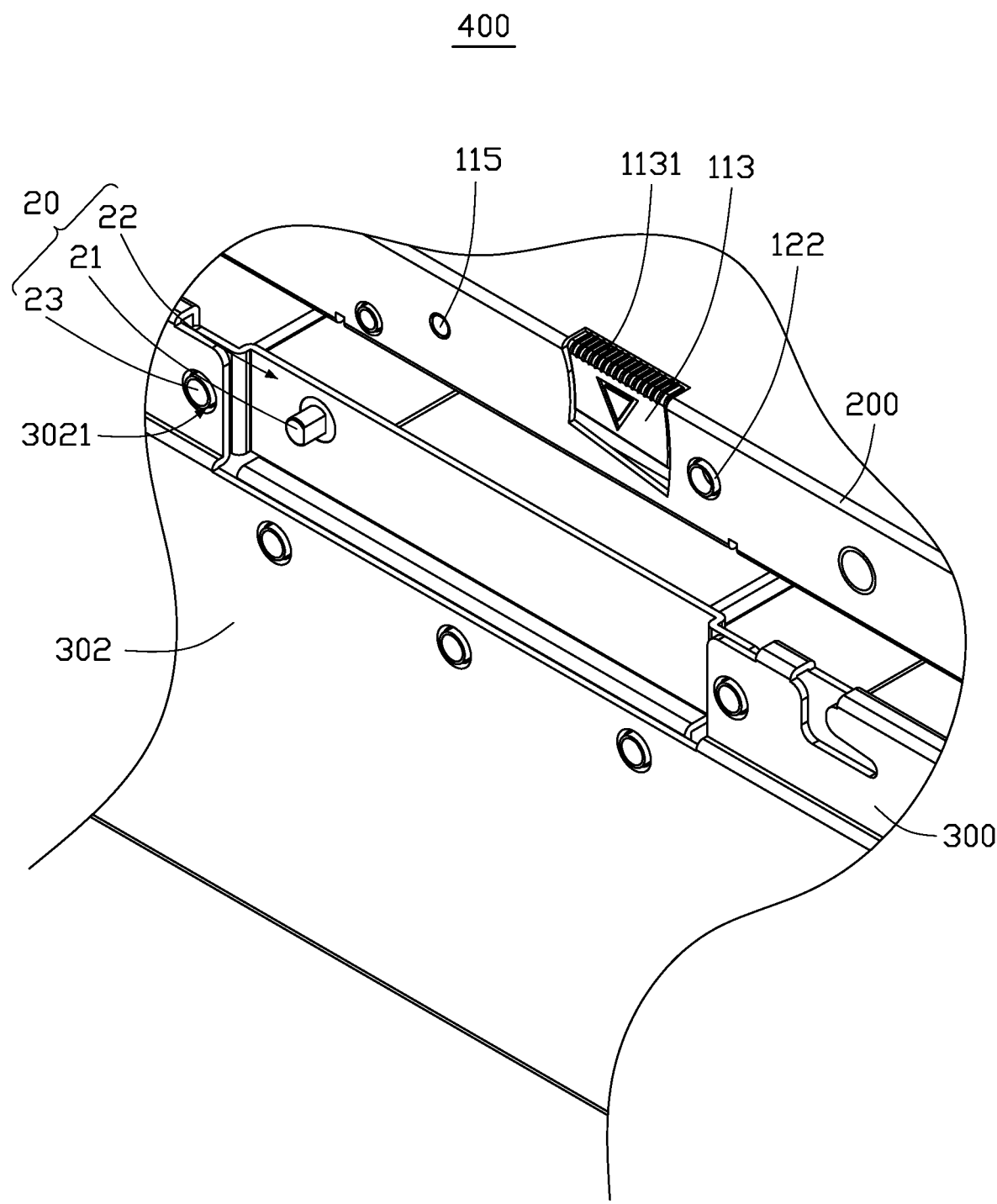
FIG. 4 is an assembled, isometric view of the locking structure of FIG. 3.
Figure 5:
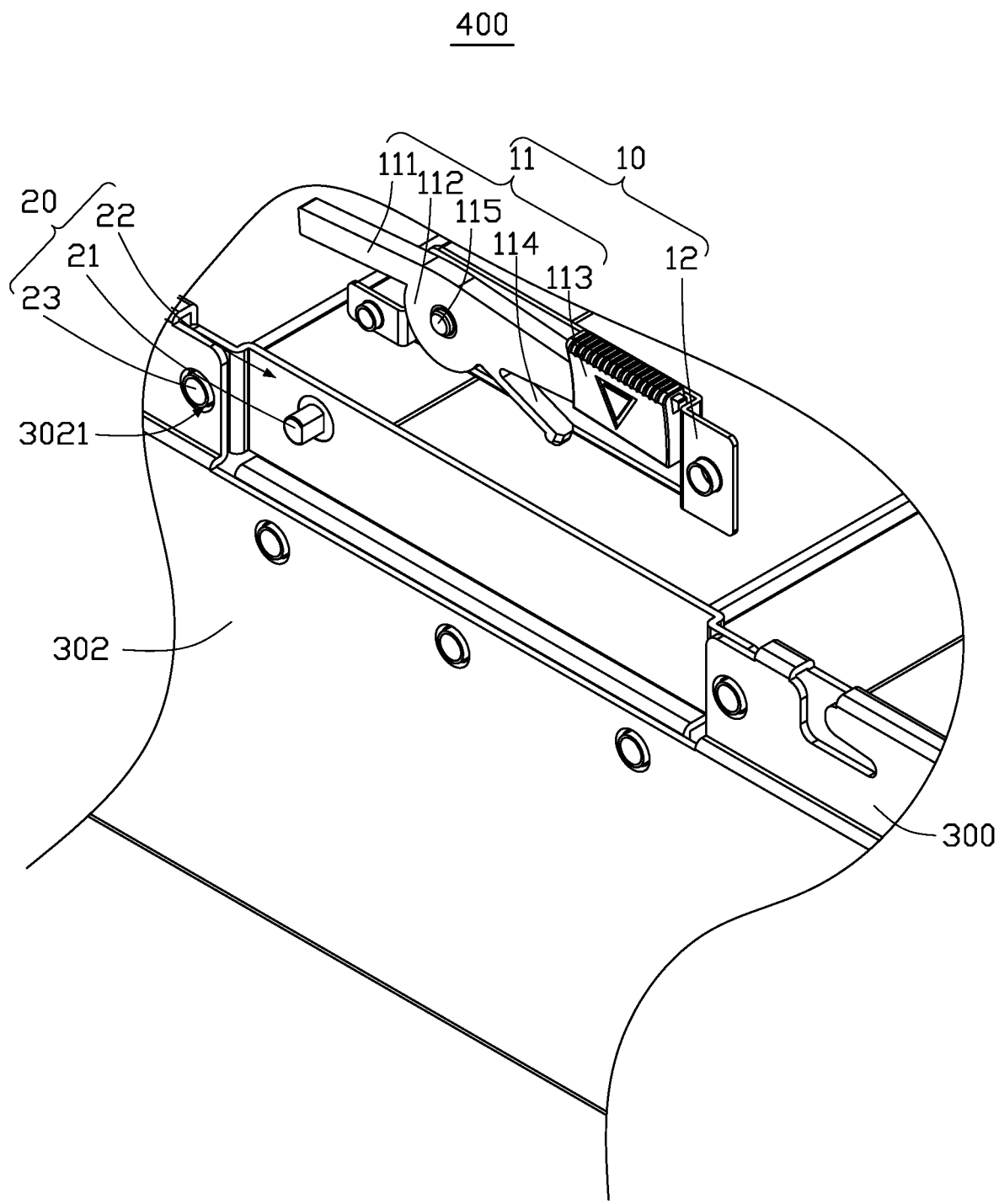
FIG. 5 is a partial assembled, isometric view of the locking structure of FIG. 3.

As illustrated in FIGS. 4 and 5 together, in this embodiment, the second locking member 20 is positioned on the second housing 300 and corresponds to the location of the first locking member 10. The second locking member 20 is substantially rectangular. The second locking member 20 is positioned on outside of the side wall 302 of the second housing 300.

The second locking member 20 includes the blocking portion 21. The second locking member 20 defines a receiving groove 22. When the first housing 200 is pressed in the first direction, the first housing 200 moves toward the second housing 300 in the first direction, and the first locking member 10 is received in the receiving groove 22. In this embodiment, a size of the receiving groove 22 is larger than the size of the connecting portion 12, allowing the connecting portion 12 to be received in the receiving groove 22 and making the pop-up portion 114 abut against a side wall of the receiving groove 22.

In this embodiment, the blocking portion 21 rests on a bottom wall of the receiving groove 22 and includes a rounded surface.

In this embodiment, the two end walls and one side wall of the receiving groove 22 extend to one side and are each bent in a direction away from the receiving groove 22. A second mounting portion 23 is formed at the bending location of the receiving groove 22. The side wall 302 of the second housing 300 defines a second mounting hole 3021. The location of the second mounting portion 23 corresponds to the location of the second mounting hole 3021. The second mounting portion 23 is fixed into the second mounting hole 3021, thereby the second locking member 20 is positioned on the second housing 300.

In this embodiment, when the locking structure 100 is installed, the first locking member 10 is firstly arranged on the inner side of the side wall of the first housing 200. Referring to FIGS. 3 to 5, first, the locking portion 11 is received in the receiving portion 121 of the connecting portion 12. Then, the side of the pressing portion 113 with the pattern 1131 is aligned with the opening 203, and the first mounting portion 122 is aligned with the first mounting hole 201. The rotating member 115 sequentially passes through the first rotating hole 123, the second rotating hole 1121, and the third rotating hole 202, and the first mounting portion 122 is fixedly mounted into the first mounting hole 201. Then, the locking portion 11 and the connecting portion 12 are installed inside the first housing 200. At this time, the locking portion 11 is sandwiched between the connecting portion 12 and the first housing 200, the locking portion 11 is rotatable relative to the connecting portion 12, and the side of the pressing portion 113 with the pattern 1131 is exposed from the opening 203.

Then, the second locking member 20 is fixedly installed on the side wall 302 of the second housing 300. Specifically, the second mounting portion 23 of the second locking member 20 is fixed to the second mounting hole 3021 of the second housing 300, and then the second locking member 20 is positioned on the second housing 300. At this time, the locking structure 100 is installed, and the location of the first locking member 10 on the inner side of the first housing 200 corresponds to the location of the second locking member 20 of the second housing 300.

Figure 6:
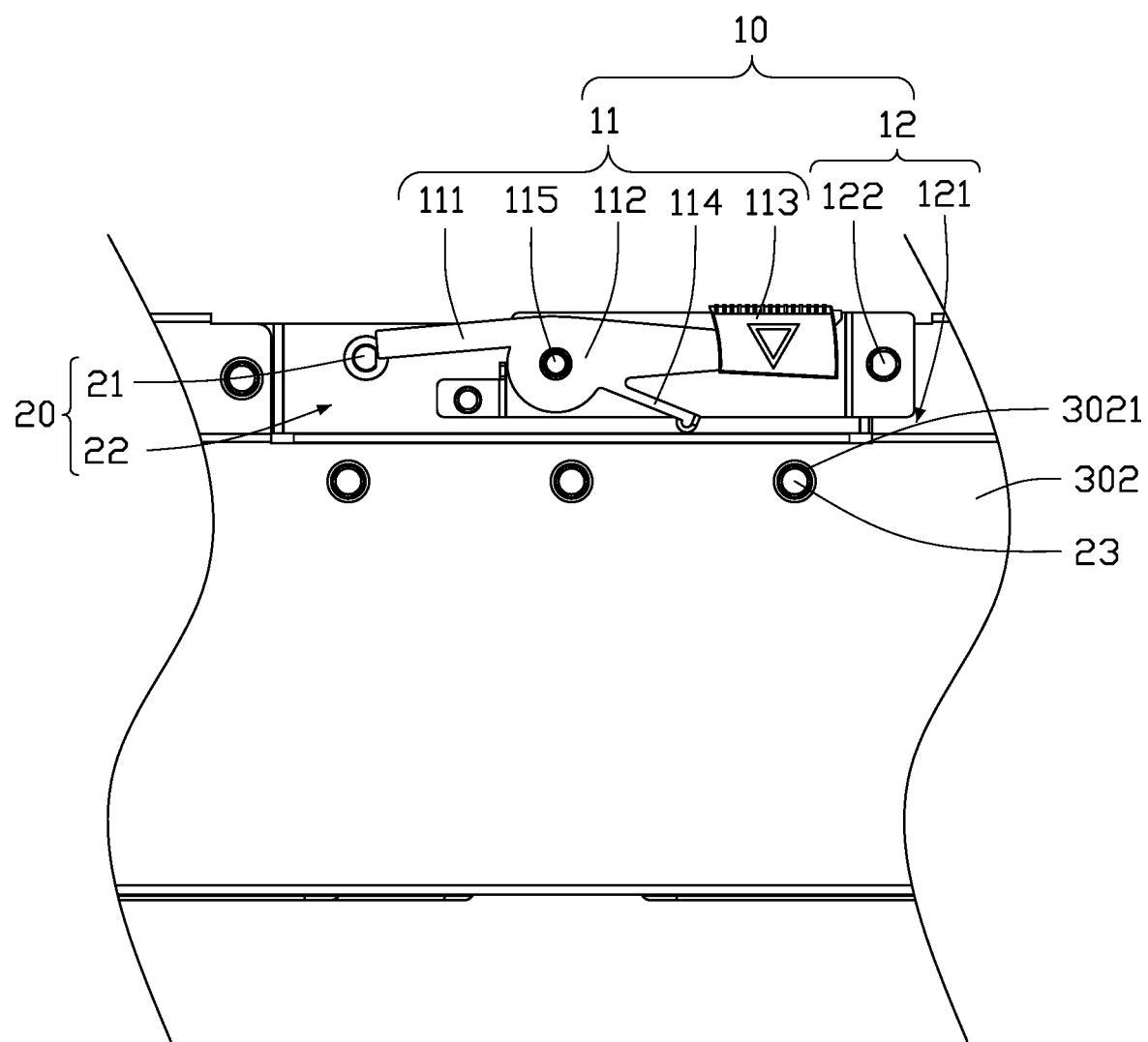
FIG. 6 is a schematic diagram of the locking structure of FIG. 3 when locked.

As illustrated in FIG. 6, when the server cabinet 400 is locked, first, the first housing 200 is pressed along the first direction, such as the vertical direction, the first housing 200 approaches the second housing 300 along the first direction, until the first locking member 10 is received in the second locking member 20. At this time, the tail portion 111 of the locking portion 11 is set against a top of the blocking portion 21. Then, the first housing 200 is pushed in a second direction, such as a horizontal direction, so that the first housing 200 approaches the top wall 301 of the second housing 300. During the pushing process, the tail portion 111 of the locking portion 11 slides along the rounded surface of the blocking portion 21, until the end of the tail portion 111 abuts against the side surface of the blocking portion 21. At this time, the first housing 200 is locked to the second housing 300. In addition, when the first housing 200 is locked to the second housing 300, the pop-up portion 114 is squeezed and abuts against the side wall of the receiving groove 22 and accumulates elastic force.

Figure 7:
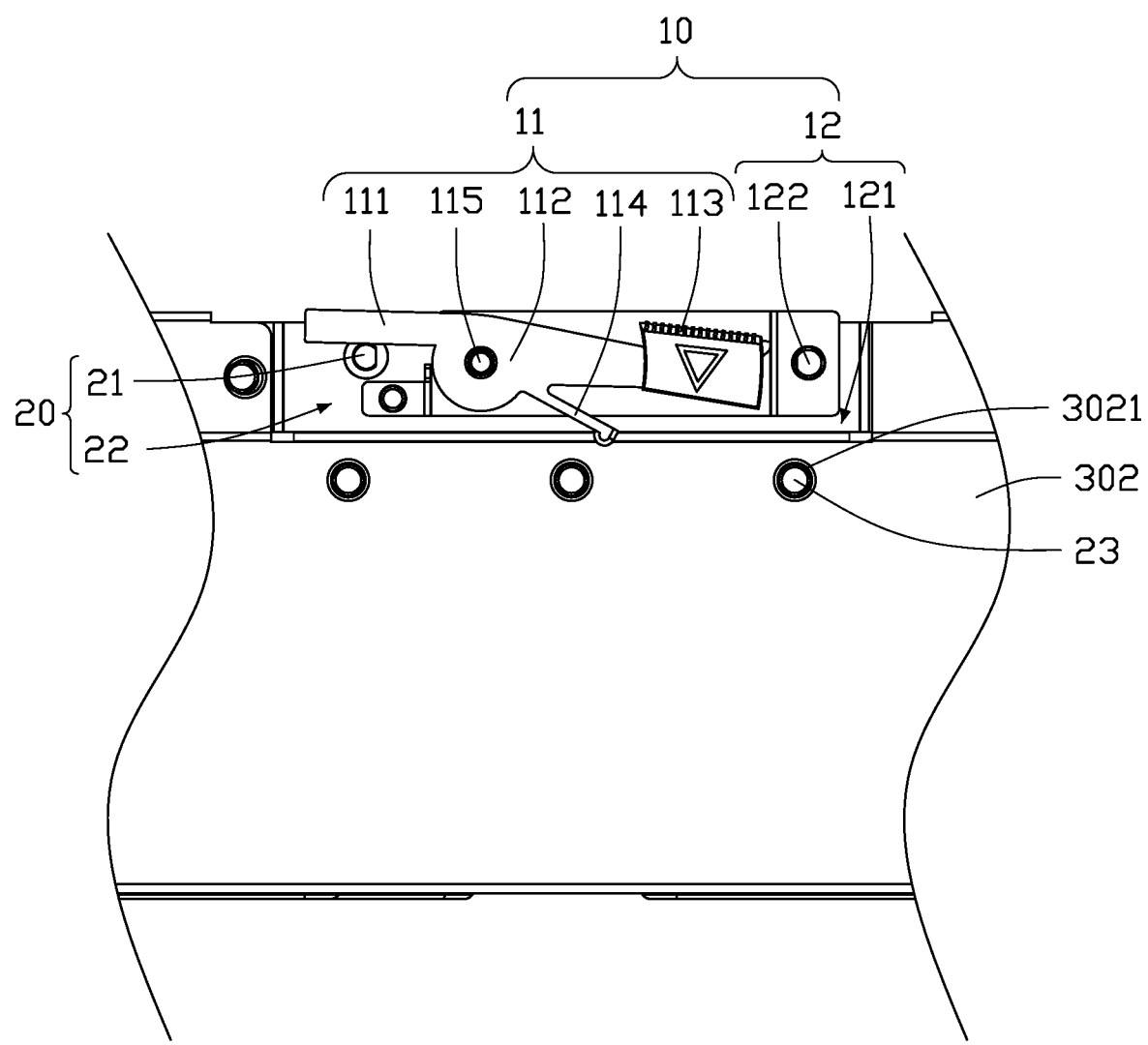
FIG. 7 is a schematic diagram of the locking structure of FIG. 3 when unlocked.

As illustrated in FIG. 7, when the server cabinet 400 needs to be unlocked, the pressing portion 113 can be operated by, for example, pressing the pressing portion 113, so that the pressing portion 113 moves along a direction toward the pop-up portion 114. At this time, the pop-up portion 114 resisting the side wall of the receiving groove 22 releases its elastic force, and the tail portion 111 associated therewith rotates, that is, the tail portion 111 rotates around the rotating member 115. In this way, the tail portion 111 will move in the opposite direction of the pressing portion 113, for example, move upward, and then slide along the side surface of the blocking portion 21 and become detached from the blocking portion 21. The tail portion 111 simultaneously pushes the first housing 200 to move in a direction away from the top wall 301, for example, to make the first housing 200 bounce. In this way, the first housing 200 and the second housing 300 are unlocked.

In this embodiment, two locking structures 100 may be installed symmetrically on the side wall of the server cabinet 400. In this way, balance and locking strength of the server cabinet 400 is maintained, and the problem of sharp-edged openings between the first housing 200 and the second housing 300 during movement is avoided, and better safety is achieved.

In this embodiment, in a width direction of the locking structure 100, a vertical thickness of the locking structure 100 is less than or equal to 6.4 mm, which is applicable to all cabinets where the width of the cabinet is limited, this disclosure having a wide range of applications.

In this embodiment, since the locking structure 100 is positioned on the side wall of the server cabinet 400, space within the server cabinet 400 is not occupied. In this way, space is saved for heat dissipation elements and cable routing, greatly improving space utilization.

In this embodiment, since the locking structure 100 is arranged on the side wall of the server cabinet 400, the server cabinet 400 has a simple and elegant appearance and is easy to install, saving labor costs and improving equipment efficiency. Furthermore, by arranging the locking structure 100 on both sides of the server cabinet 400, better safety is achieved, and space is saved.

It is believed that the embodiments and their advantages will be understood from the foregoing description, and it will be apparent that various changes may be made thereto without departing from the scope of the disclosure or sacrificing all of its advantages, the examples hereinbefore described merely being illustrative embodiments of the disclosure.

What is claimed is:

1. A locking structure for locking a first housing to a second housing, the locking structure comprising:
a first locking member configured to be positioned at the first housing and comprising a locking portion, the locking portion comprising a tail portion; and
a second locking member configured to be positioned at the second housing and comprising a blocking portion, the blocking portion comprising a rounded surface;
wherein when the first housing is configured to be pressed along a first direction, the first housing is configured to approach the second housing until the first locking member is received in the second locking member, the tail portion is set against a top of the blocking portion;
wherein the first housing is further configured to be pushed in a second direction, the tail portion slides along the rounded surface of the blocking portion until the tail portion abuts against the blocking portion to lock the first housing to the second housing.

2. The locking structure of claim 1, wherein the first locking member further comprises a connecting portion, the connecting portion is configured to be positioned on the first housing and is configured to receive the locking portion.

3. The locking structure of claim 2, wherein the connecting portion forms a receiving portion, the receiving portion is configured to receive the locking portion, the receiving portion further forms a first mounting portion, the connecting portion is configured to be assembled to the first housing through the first mounting portion.

4. The locking structure of claim 3, wherein the receiving portion defines a first rotating hole, the locking portion defines a second rotating hole, the first housing is further configured to define a third rotating hole, a rotating member passes through the first rotating hole, the second rotating hole, and the third rotating hole, the locking portion is installed on the connecting portion and rotates around the rotating member.

5. The locking structure of claim 2, wherein the second locking member defines a receiving groove, a side of the receiving groove forms a second mounting portion, the second locking member is configured to be assembled to the second housing through the second mounting portion.

6. The locking structure of claim 5, wherein the locking portion further comprises a plate body and a pressing portion, the tail portion is positioned at one end of the plate body, the pressing portion is positioned at the other end of the plate body opposite to the tail portion, the tail portion, the plate body, and the pressing portion are connected in sequence and formed integrally.

7. The locking structure of claim 6, wherein a side wall of the first housing is configured to define an opening, the first locking member is configured to be positioned at an inner side of the side wall of the first housing and the pressing portion is exposed from the opening.

8. The locking structure of claim 6, wherein the pressing portion forms a pattern.

9. The locking structure of claim 6, wherein the locking portion further comprises a pop-up portion, the pop-up portion extends from the connection between the plate body and the pressing portion in a direction away from the pressing portion and is made of elastic material.

10. A server cabinet comprising:
a first housing;
a second housing; and
a locking structure comprising:
a first locking member positioned at the first housing and comprising a locking portion, the locking portion comprising a tail portion; and
a second locking member positioned at the second housing and comprising a blocking portion, the blocking portion comprising a rounded surface;
wherein when the first housing is pressed along a first direction, the first housing approaches the second housing until the first locking member is received in the second locking member, the tail portion is set against a top of the blocking portion;
wherein the first housing is further pushed in a second direction, the tail portion slides along the rounded surface of the blocking portion until the tail portion abuts against the blocking portion to lock the first housing to the second housing.

11. The server cabinet of claim 10, wherein the first locking member further comprises a connecting portion, the connecting portion is positioned on the first housing and is configured to receive the locking portion.

12. The server cabinet of claim 11, wherein the connecting portion forms a receiving portion, the receiving portion is configured to receive the locking portion, the receiving portion further forms a first mounting portion, the first housing defines a first mounting hole, the first mounting portion passes through the first mounting hole.

13. The server cabinet of claim 12, wherein the receiving portion defines a first rotating hole, the locking portion defines a second rotating hole, the first housing further defines a third rotating hole, a rotating member passes through the first rotating hole, the second rotating hole, and the third rotating hole, the locking portion is installed on the connecting portion and rotates around the rotating member.

14. The server cabinet of claim 11, wherein the second locking member defines a receiving groove, a side of the receiving groove forms a second mounting portion, the second housing defines a second mounting hole, the second mounting portion passes through the second mounting hole.

15. The server cabinet of claim 14, wherein the locking portion further comprises a plate body and a pressing portion, the tail portion is positioned at one end of the plate body, the pressing portion is positioned at the other end of the plate body opposite to the tail portion, the tail portion, the plate body, and the pressing portion are connected in sequence and formed integrally.

16. The server cabinet of claim 15, wherein a side wall of the first housing defines an opening, the first locking member is positioned at an inner side of the side wall of the first housing and the pressing portion is exposed from the opening.

17. The server cabinet of claim 15, wherein the pressing portion forms a pattern.

18. The server cabinet of claim 15, wherein the locking portion further comprises a pop-up portion, the pop-up portion extends from the connection between the plate body and the pressing portion in a direction away from the pressing portion and is made of elastic material.

* * * * *